United States Patent [19]
Hopkins

[11] Patent Number: 5,359,244
[45] Date of Patent: Oct. 25, 1994

[54] GATE DRIVE CIRCUIT FOR A MOS POWER TRANSISTOR

[75] Inventor: Thomas L. R. Hopkins, Cary, Ill.

[73] Assignee: SGS-Thomson Microelectronics, Inc., Carrollton, Tex.

[21] Appl. No.: 923,266

[22] Filed: Jul. 31, 1992

[51] Int. Cl.⁵ .......................................... H03K 17/687
[52] U.S. Cl. ................................. 307/571; 307/227; 307/246
[58] Field of Search ............... 307/571, 263, 443, 572, 307/584, 227, 246; 307/227, 246

[56] References Cited
U.S. PATENT DOCUMENTS

| | | | |
|---|---|---|---|
| 4,540,893 | 10/1985 | Bloomer | 307/571 |
| 4,967,109 | 10/1990 | Steigerwald | 307/571 |
| 4,992,683 | 2/1991 | Robin, Jr. | 307/571 |
| 5,023,474 | 6/1991 | Wilcox | 307/571 |

Primary Examiner—Timothy P. Callahan
Assistant Examiner—Shawn Riley
Attorney, Agent, or Firm—Kenneth C. Hill; Lisa K. Jorgenson; Richard K. Robinson

[57] ABSTRACT

An improved gate drive circuit for a MOS power transistor utilizes a dual gate drive circuit configuration. The first gate drive circuit operates to quickly turn on the MOS power transistor. After the MOS power transistor is turned on, the first gate drive circuit can be disabled. A second gate drive circuit is employed to provide continuous drive to the gate of the MOS power transistor to keep the MOS power transistor on.

16 Claims, 2 Drawing Sheets

GATE DRIVE CIRCUIT FOR A MOS POWER TRANSISTOR

BACKGROUND OF THE INVENTION

1. Technical Field

The present invention relates generally to integrated circuits, and more particularly to gate drive circuits utilized in integrated circuits for driving high-side N channel MOS power transistors. 2. Description of the Related Art Power devices that have a high side N-channel MOS power transistor typically require a voltage level greater than the supply voltage to drive the gate of the N-channel MOS power transistor. One technique which has been used to derive the required increased voltage level is to employ a bootstrap capacitor. A disadvantage to using a bootstrap capacitor, however, is that it requires a large external capacitor. Furthermore, a circuit which utilizes a bootstrap capacitor can not be left on for long periods of time. As known in the art, the charge within the bootstrap capacitor drains off, and the bootstrap capacitor can not be recharged without turning the MOS power transistor off.

Another technique which is used to derive the required increase voltage level is a gate drive circuit, known in the art as a charge pump. A charge pump can be implemented either in a continuous running mode or as a circuit that works only on demand. Typically, a single charge pump is utilized in circuits which require charge pumps.

One disadvantage to using a single charge pump is that the switching time of the MOS power transistor is limited by the gate rise time produced by the charge pump. Additionally, when designing a charge pump, a tradeoff occurs between the current consumption of the charge pump versus the rise time of the gate of the MOS power transistor. This is especially true in NMOS designs where the pullup devices are resistor elements.

Therefore, it would be desirable to provide a charge pump circuit which reduces the gate rise time and the output switching time of a MOS power transistor. It is also desirable that the current consumption of the charge pump circuit be minimized.

SUMMARY OF THE INVENTION

An improved gate drive circuit for a MOS power transistor utilizes a dual gate drive circuit configuration. The first gate drive circuit operates to quickly turn on the MOS power transistor. After the MOS power transistor is turned on, the first gate drive circuit can be disabled. A second gate drive circuit is employed to provide continuous drive to the gate of the MOS power transistor to keep the MOS power transistor on.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENTS

Figure 1:
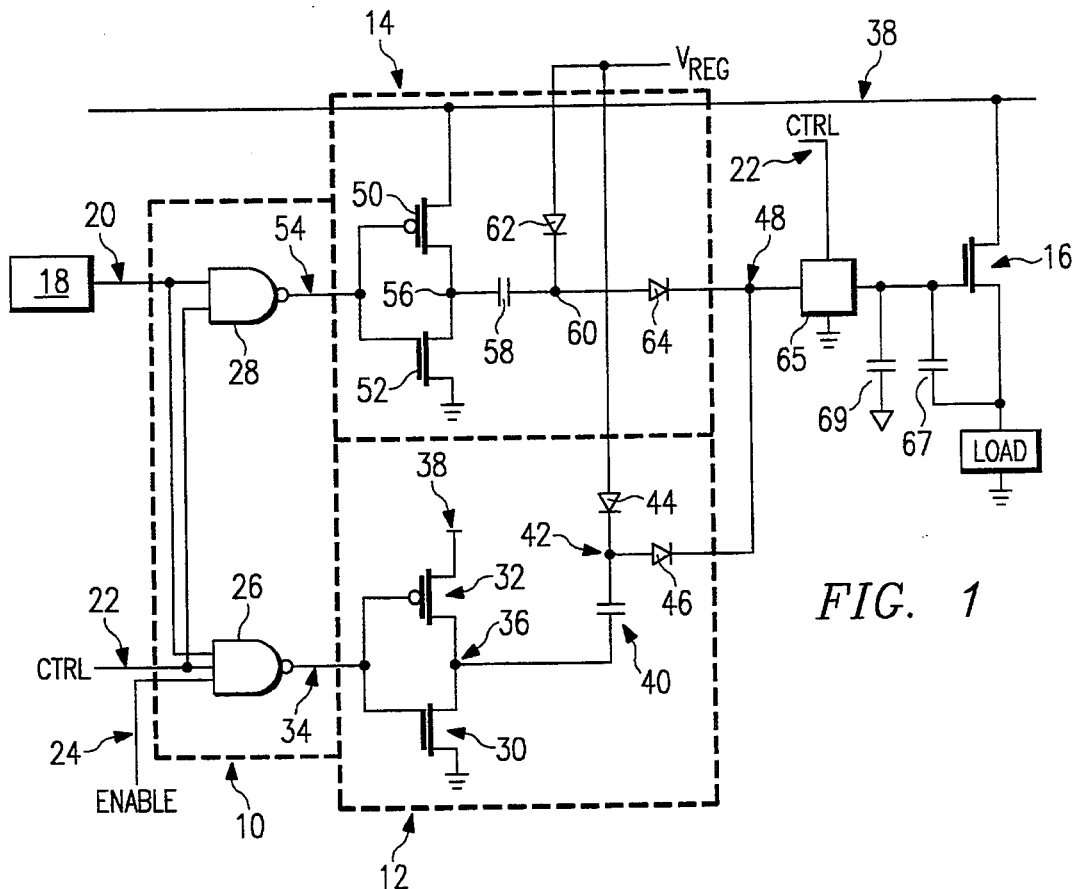
FIG. 1 is a block diagram of a preferred circuit for driving a MOS power transistor according to the present invention.

Referring to FIG. 1, a block diagram is shown of a preferred circuit for driving a MOS power transistor according to the present invention. The circuit comprises a control circuit 10, a first gate drive circuit 12, a second gate drive circuit 14, and a MOS power transistor 16. An oscillator or clock 18 generates a signal 20. The signal 20 along with input signals CTRL and ENABLE on lines 22, 24, respectively, enter the control circuit 10.

As can be seen, the control circuit 10 comprises two NAND gates 26, 28. Signal 20 and CTRL signal on line 22 are inputs to both NAND gates 26, 28. CTRL signal is utilized to indicate the MOS power transistor 16 is to be turned on. ENABLE signal on line 24 is an input only into NAND gate 26, and is used to enable and disable the first gate drive circuit 12. ENABLE signal enables the first gate drive circuit 12 by, for example, changing from a low voltage state to a high voltage state.

First gate drive circuit 12 is comprised of complementary transistors 30, 32 which form a CMOS inverter. Thus, when the output 34 from NAND gate 26 is high, transistor 32 is off and transistor 30 is on, pulling node 36 to ground. When the output 34 is low, transistor 32 is on and transistor 30 is off pulling node 36 to the supply voltage 38.

First gate drive 12 also contains a capacitor 40 and two diodes 44, 46. Diodes 44, 46 are connected to a regulated voltage supply $V_{reg}$. $V_{reg}$ may be derived from the supply voltage 38 by a voltage regulator. When the voltage level at node 36 is pulled to ground, capacitor 40 is charged through diode 44. When the voltage at node 36 goes high, caused by the clock 18 changing state, the voltage level at node 36 is pulled to the supply voltage and the charged stored in capacitor 40 is transferred to the gate of MOS power transistor 16. This pattern repeats with each clock cycle in the signal from clock 18.

When the voltage level at node 42 rises above a level equal to $V_{reg}$ less the forward drop on diode 44, diode 44 turns off, thereby isolating node 42 from $V_{reg}$. When the voltage level at node 42 becomes greater than the voltage level at node 48, diode 46 turns on and begins charging node 48 connected to the gate of MOS power transistor 16. The MOS power transistor 16 turns on when the voltage level on the gate becomes higher than the gate threshold voltage. In the preferred embodiment, the voltage level at node 48 is driven approximately 10 volts above the supply voltage 38 in order to ensure that the MOS power transistor 16 is fully on.

First gate drive circuit 12 is preferably a gate drive circuit that transfers a large amount of charge in each clock cycle and therefore provides a fast turn on of the MOS power transistor 16. Therefore, capacitor 40 in first gate drive circuit 12 is much larger than capacitor 58 in second gate drive circuit 14. Also, in the preferred embodiment, first gate drive circuit 12 operates for only predetermined period of time. First gate drive circuit 12 is disabled by, for example, causing ENABLE signal on line 24 to go from a high voltage state to a low voltage state.

Still referring to FIG. 1, the second gate drive circuit 14 is also comprised of complementary transistors 50, 52, which form a CMOS inverter. When the output 54 from NAND gate 28 is high, transistor 50 is off and transistor 52 is on, pulling node 56 to ground. When the output 54 is low, transistor 50 is on and transistor 52 is off pulling node 56 to the supply voltage 38.

The second gate drive circuit 14 also contains a capacitor 58 and two diodes 62, 64. Diodes 62, 64 are connected to a regulated voltage supply $V_{reg}$. Second gate drive circuit 14 operates in the same manner as first gate drive circuit 12 to generate a voltage at node 48 that is approximately 10 volts above the supply voltage 38. Diodes 46 and 64 serve to isolate the capacitors 40 and 58 from node 48, and from each other.

In the preferred embodiment, second gate drive circuit 14 provides a continuous drive to the gate of the MOS power transistor 16, and is used primarily to keep the MOS power transistor 16 turned on by overcoming any leakages from its gate. Thus, the transistors 50, 52, and capacitor 58 are selected in a manner to provide only enough energy to overcome the leakage from the gate of MOS power transistor 16, and thereby minimize the current consumption while the MOS power transistor 16 is turned on.

Finally, capacitors 67, 69 represent the intrinsic and stray capacitance which exists in the MOS power transistor 16, and block 65 represents means for switching the MOS power transistor 16 to ground. During operation of the output driver circuit, it may become desirable to turn MOS power transistor off for various periods of time. CRTL signal on line 22 is utilized in block 65 to indicate whether MOS power transistor should be on or off. Block 65 is comprised of switching means to quickly connect the gate of MOS power transistor 16 to ground, thereby turning MOS power transistor 16 off quickly.

Thus, the signal from the clock 18 allows for the pumping of charge by alternately driving nodes 36 and 56 to ground and then to the supply voltage. The CRTL signal is utilized to indicate whether the MOS power transistor should be on or off, and enables the gate drive circuits 12, 14 through NAND gates 26, 28. The ENABLE signal is utilized to enable and disable the first gate drive circuit 12. The first gate drive circuit 12 is enabled when the MOS power transistor 16 is first turned on, and disabled after a period of time sufficient to allow the node 48 to become charged to the desired level.

Figure 2:
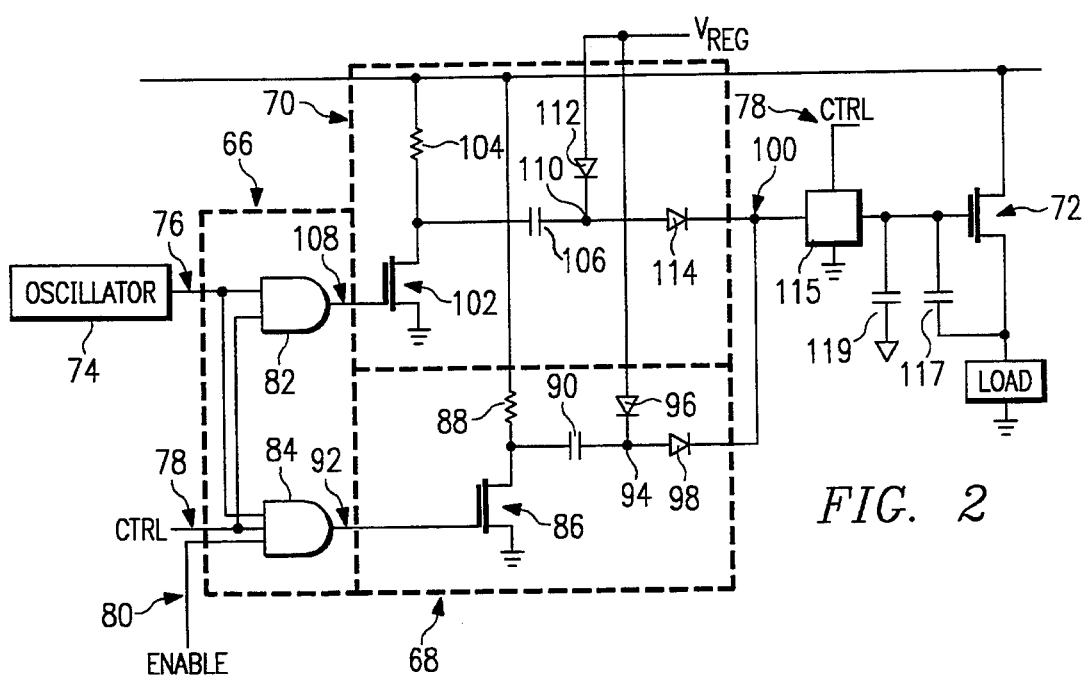
FIG. 2 is a block diagram of an alternate preferred circuit for driving a MOS power transistor according to the present invention.

FIG. 2 is a block diagram of an alternate preferred circuit for driving a MOS power transistor according to the present invention. The circuit of FIG. 2 is implemented using NMOS technology. The circuit is comprised of a control circuit 66, a first gate drive circuit 68, a second gate drive circuit 70, and a MOS power transistor 72. An oscillator or clock 74 generates a signal 76. The signal 76 along with input signals CTRL and ENABLE on lines 78, 80 enter the control circuit 66.

As can be seen, the control circuit 66 is comprised of two AND gates 82, 84. Signal 76 and input signal 78 are inputs to both AND gates 82, 84. Input signal 78 is utilized to indicate the MOS power transistor 72 is to be turned on. Input signal 80 is an input only to AND gate 84, and is used to enable and disable the first gate drive circuit 68. Input signal 80 enables first gate drive circuit 68 by, for example, changing from a low voltage state to a high voltage state.

The first gate drive circuit 68 is comprised of a transistor 86, a resistor element 88, a capacitor 90 and two diodes 96, 98. Diodes 96, 98 are connected to a regulated voltage supply $V_{reg}$ which can be derived from the supply voltage as described above. Resistor element 88 can be implemented, for example, by a resistor or a depletion mode N-channel device.

First gate drive circuit 68 operates in a manner analogous to first gate drive circuit 12 in FIG. 1. When the output 92 from AND gate 84 is high, transistor 86 turns on and capacitor 90 is charged. When clock 18 changes state, the output 92 from AND gate 84 goes low, transistor 86 turns off, and the charge stored in capacitor 90 is transferred to the gate of MOS power transistor 72. This pattern is repeated with each cycle from the clock 18.

When the voltage level at node 94 rises above a level equal to $V_{reg}$ less the forward drop on diode 96, diode 96 turns off, thereby isolating node 94 from the supply voltage. When the voltage level at node 94 becomes greater than the voltage level at node 100, diode 98 turns on and begins charging node 100 connected to the gate of MOS power transistor 72. MOS power transistor 72 turns on when the voltage level on the gate becomes higher than the gate threshold voltage.

In the preferred embodiment, the first gate drive circuit 68 transfers a large amount of charge in each clock cycle and therefore provides a fast turn on of the MOS power transistor 72. Therefore, capacitor 90 in first gate drive circuit 68 is much larger than capacitor 106 in second gate drive circuit 70, and resistor element 88 in first gate drive circuit 68 is much smaller than resistor element 104. Also, first gate drive circuit 68 preferably operates for only a short time during which the MOS power transistor 72 is turned on. After a predetermined period of time, first gate drive circuit 68 is disabled by, for example, causing ENABLE signal on line 80 to go from a high voltage state to a low voltage state.

Still referring to FIG. 2, the second gate drive circuit 70 also contains a transistor 102, a resistor element 104, a capacitor 106 and two diodes 112, 114. Diodes 112, 114 are connected to a regulated voltage supply $V_{reg}$. Resistor element 104 can be implemented, for example, by a resistor or a depletion mode N-channel device. As was the case for FIG. 1, second gate drive circuit 70 operates in the same manner as first gate drive circuit 68.

In the preferred embodiment, second gate drive circuit 70 provides a continuous drive to the gate of the MOS power transistor 72 and is used primarily to keep the MOS power transistor 72 turned on by overcoming any leakages in the drive circuit. Therefore, transistor 102, resistor element 104, and capacitor 106, are selected in order to provide only enough energy to overcome the leakage in the output and minimize the current consumption while the MOS power transistor 72 is turned on.

Finally, capacitors 117, 119 represent the intrinsic and stray capacitance which exists in the MOS power transistor 76, and block 115 represents means for switching the MOS power transistor 76 to ground.

Switching block 115 is the same as block 65 described in connection with FIG. 1.

Figure 3A:
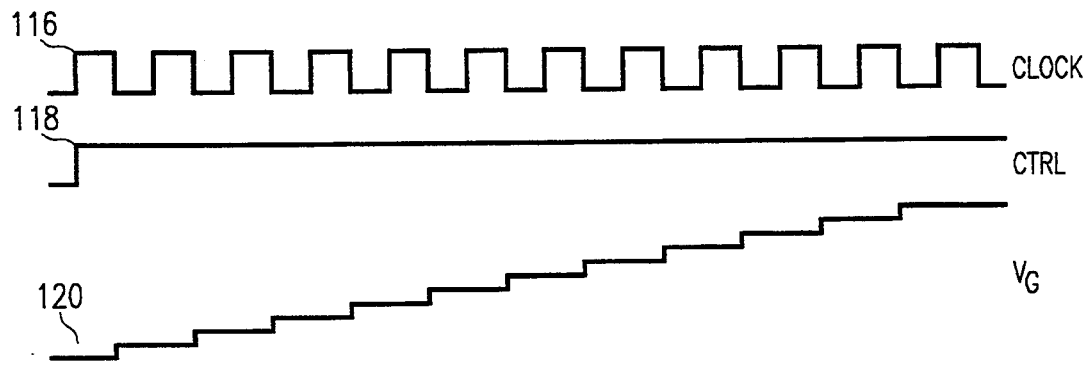
FIG. 3a is a timing diagram representing a timing sequence among the signals in a prior art circuit for driving a MOS power transistor.

Referring to FIG. 3a, a timing diagram illustrates a timing sequence among the signals in a prior art circuit for driving a MOS power transistor. As known in the art, the prior art circuit contains only a single gate drive circuit. An oscillator or clock signal 116 is shown, along with CTRL signal on line 118. The voltage level at the gate of the MOS power transistor is illustrated by diagram 120. As can be seen, it takes several clock cycles for the voltage level $V_G$ to reach its maximum and required level to fully turn on the MOS power transistor.

Figure 3B:
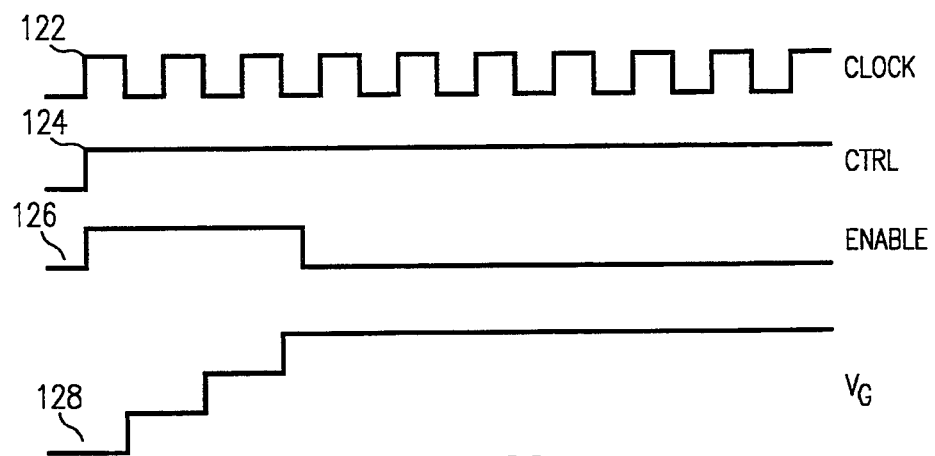
FIG. 3b is a timing diagram representing a timing sequence among the signals in a preferred circuit for driving a MOS power transistor according to the present invention.

FIG. 3b illustrates a timing diagram representing a timing sequence among the signals in the preferred circuit for driving the MOS power transistor according to the present invention. An oscillator or clock signal 122 is shown, along with CTRL signal 124. ENABLE signal is illustrated with line 126. As discussed above, signal 126 is used to enable the fast gate drive circuit which is used to quickly turn on the MOS power transistor. The fast gate drive circuit is then disabled as indicated by signal 126 going low.

By utilizing one of the fast gate drive circuits in the preferred embodiment, the voltage level at the gate of the MOS power transistor reaches its maximum and required level faster than what is previously reached in the prior art. This is illustrated by signal 128 labeled $V_G$ in FIG. 3b. Because nodes 48 and 100 always have a voltage level equal to the supply voltage, charging of the MOS power transistor begins with the supply voltage.

The present invention utilizes a dual gate drive circuit configuration to allow for quick turn on of a MOS power transistor while minimizing the current required to keep the MOS power transistor turned on. This is accomplished by using one gate drive circuit to quickly charge up the gate of the MOS power transistor, and then disabling the quick gate drive circuit. Although the quick gate drive circuit requires a high current, the high current is needed for only a short time. The second gate drive circuit provides a continuous drive to the gate of the MOS power transistor, and is used primarily to keep the MOS power transistor fully on by overcoming any leakages from the gate. This gives the benefit of fast turn on for the MOS power transistor, combined with a low current demand for the gate drive circuit used to maintain the gate voltage.

While the invention has been particularly shown and described with reference to a preferred embodiment, it will be understood by those skilled in the art that various changes in form and detail may be made therein without departing from the spirit and scope of the invention.

What is claimed is:

1. A circuit for driving a MOS power transistor, comprising:

a first gate drive circuit for charge pumping a node connected to a gate of the MOS power transistor to a gate supervoltage higher than a positive supply voltage by at least an amount equal to a threshold voltage of the MOS power transistor, wherein the first gate drive circuit utilizes a first charge current to charge the MOS power transistor gate to the gate supervoltage at a first rate;

a second gate drive circuit for charge pumping the node connected to the gate of the MOS power transistor to maintain the voltage on such node at the gate supervoltage, wherein the second gate drive circuit utilizes a second charge current, less than the first charge current, to charge the MOS power transistor gate to the gate supervoltage at a second rate which is slower than the first rate; and a control circuit, wherein the control circuit enables the first and second gate drive circuits when the MOS power transistor is initially turned on, and thereafter disables the first gate drive circuit after a selected period of time.

2. The circuit of claim 1, wherein the first gate drive circuit comprises:

two transistors connected in series to form a CMOS inverter circuit;

a capacitor connected to the output of the CMOS inverter circuit; and a first and a second diode connected to the capacitor, with the first diode connected to the gate of the MOS power transistor, and the second diode connected to a regulated voltage supply.

3. The circuit of claim 2, wherein the two transistors connected in series and the capacitor are selected in order to provide a relatively large amount of charge to the MOS power transistor when initially turned on.

4. The circuit of claim 1, wherein the second gate drive circuit comprises:

two transistors connected in series to form a CMOS inverter circuit;

a capacitor connected to the output of the CMOS inverter circuit; and a first and a second diode connected to the capacitor, with the first diode connected to the gate of the MOS power transistor, and the second diode connected to a regulated voltage supply.

5. The circuit of claim 4, wherein the two transistors connected in series and the capacitor are selected in order to provide a low charge sufficient to keep the MOS power transistor turned on.

6. The circuit of claim 1, wherein the first gate drive circuit comprises:

a field effect transistor;

a resistor element connected in series with the field effect transistor;

a capacitor connected in series with the field effect transistor; and a first and a second diode connected to the capacitor, with the first diode connected to the gate of the MOS power transistor, and the second diode connected to a regulated voltage supply.

7. The circuit of claim 6, wherein the field effect transistor, the resistor element and the capacitor are selected in order to provide a relatively large amount of charge to the MOS power transistor when initially turned on.

8. The circuit of claim 6, wherein the resistor element comprises a depletion mode N-channel device.

9. The circuit of claim 1, wherein the second gate drive circuit comprises:

a field effect transistor;

a resistor element connected in series with the field effect transistor;

a capacitor connected in series with the field effect transistor; and a first and a second diode connected to the capacitor, with the first diode connected to the gate of the MOS power transistor, and the second diode connected to a regulated voltage supply.

10. The circuit of claim 9, wherein the field effect transistor, the resistor element and the capacitor are selected in order to provide a low charge sufficient to keep the MOS power transistor turned on.

11. The circuit of claim 9, wherein the resistor element comprises a depletion mode N-channel device.

12. The circuit of claim 1, wherein the control circuit comprises two NAND gates.

13. The circuit of claim 1, further comprising means for connecting the gate of the MOS power transistor to ground, wherein the MOS power transistor can be turned off when desired.

14. A method for driving a MOS power transistor, comprising the steps of:

when the MOS power transistor is turned on, charging a node connected to a gate thereof to a gate supervoltage higher than a positive supply voltage by at least an amount equal to a threshold voltage of the MOS power transistor, utilizing a first charge current to charge the node at a first rate; and after a predetermined time period, maintaining the voltage on the node at the gate supervoltage utilizing a second charge current, less than the first charge current, to charge the MOS power transistor gate to the gate supervoltage at a at a second rate, wherein said second rate is slower than said first rate.

15. The method of claim 14, wherein said step of charging the node connected to the gate thereof at the first rate comprises charging the node using a first and a second gate drive circuit.

16. The method of claim 15, wherein said step of charging the node at a second rate comprises turning off the first gate drive circuit, wherein only the second gate drive circuit charges the node.

* * * * *

UNITED STATES PATENT AND TRADEMARK OFFICE
CERTIFICATE OF CORRECTION

PATENT NO.       : 5,359,244
APPLICATION NO.  : 07/923266
DATED            : October 25, 1994
INVENTOR(S)      : Thomas L.R. Hopkins It is certified that error appears in the above-identified patent and that said Letters Patent is hereby corrected as shown below:

Claim 10, Column 8, Line 7          Delete "at a" after "Supervoltage"

Signed and Sealed this

Twenty-sixth Day of June, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 5,359,244 | Page 1 of 1 |
| APPLICATION NO. | : 07/923266 | |
| DATED | : October 25, 1994 | |
| INVENTOR(S) | : Thomas L.R. Hopkins | |

It is certified that error appears in the above-identified patent and that said Letters Patent is hereby corrected as shown below:

Column 8, Line 7     Delete "at a" after "supervoltage"

Signed and Sealed this

Seventeenth Day of July, 2007

JON W. DUDAS
*Director of the United States Patent and Trademark Office*